US006834127B1

(12) United States Patent
Yamamoto

(10) Patent No.: US 6,834,127 B1
(45) Date of Patent: Dec. 21, 2004

(54) METHOD OF ADJUSTING OUTPUT IMAGE AREAS

(75) Inventor: Hiroyasu Yamamoto, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 799 days.

(21) Appl. No.: 09/715,169

(22) Filed: Nov. 20, 2000

(30) Foreign Application Priority Data

Nov. 18, 1999 (JP) ........................................... 11-328194

(51) Int. Cl.[7] ............................ G06K 9/36; G06K 9/66; G03F 3/10

(52) U.S. Cl. ........................ 382/282; 382/190; 358/537

(58) Field of Search ................................ 382/181, 190, 382/199, 165, 203, 282; 358/500, 537, 538

(56) References Cited

U.S. PATENT DOCUMENTS 5,740,274 A * 4/1998 Ono et al. .................. 382/282

FOREIGN PATENT DOCUMENTS

| | | | |
|---|---|---|---|
| JP | 4-346336 | 12/1992 | G03B/27/73 |
| JP | 5-158164 | 6/1993 | G03B/27/80 |
| JP | 5-165119 | 6/1993 | G03B/27/73 |
| JP | 5-165120 | 6/1993 | G03B/27/80 |
| JP | 6-67320 | 3/1994 | G03B/27/80 |
| JP | 6-160993 | 6/1994 | G03B/27/73 |
| JP | 8-184925 | 7/1996 | G03B/27/80 |

OTHER PUBLICATIONS

Patent Abstracts of Japan 08184925 Jul. 16, 1996.
Patent Abstracts of Japan 04346334 Dec. 2, 1992.
Patent Abstracts of Japan 05158164 Jun. 25, 1993.
Patent Abstracts of Japan 05165119 Jun. 29, 1993.
Patent Abstracts of Japan 05165120 Jun. 29, 1993.
Patent Abstracts of Japan 06067320 Mar. 11, 1994.
Patent Abstracts of Japan 06160993 Jun. 7, 1994.

* cited by examiner

*Primary Examiner*—Leo Boudreau
*Assistant Examiner*—Duy M. Dang
(74) *Attorney, Agent, or Firm*—Sughrue Mion, PLLC

(57) ABSTRACT

The method adjusts an output image area for producing an output image from a recorded area of an original image within the recorded area of the original image so as to produce output image data that complies with a predetermined output image size. The method extracts the recorded area of the original image, extracts at least one region of a principal subject, a finger image and a fog region from the extracted recorded area of the original image to obtain an extracted region. The method adjusts the output image area automatically in accordance with the extracted region and obtains output image data from the image data in the adjusted output image area. Alternatively, the method issues information for urging an adjustment of the output image area when it is determined as a result of the extracted region that the adjustment of the output image area is necessary.

27 Claims, 6 Drawing Sheets

METHOD OF ADJUSTING OUTPUT IMAGE AREAS

BACKGROUND OF THE INVENTION

This invention relates to a method for automatic or semiautomatic adjustment of output image areas for producing output images from an original image. The invention particularly relates to the technical field of a method for adjustment of output image areas which is employed when performing image processing on a large quantity of acquired original images and displaying the processed images as output images for verification, or outputting images that have been subjected to image processing in accordance with the result of verification as prints or image data recording media, or delivering them via a network.

The images recorded on photographic films such as negative films and reversal films (which are hereunder referred to simply as "films") are recently printed on light-sensitive materials (photographic paper) by digital exposure. In this new technology, the image recorded on a film is read photoelectrically, converted to digital signals and subjected to various image processing schemes to produce image data for recording purposes; recording light modulated in accordance with the image data is used to scan and expose a light-sensitive material to record an image (latent image), which is subsequently developed to produce a (finished) print. The printer operating on this principle has been commercialized as a digital printer.

In the digital photoprinter, images can be processed as digital image data to determine the exposure conditions for printing, so various operations including the correction of washed-out highlights or flat (dull) shadows due to the taking of pictures with rear light or an electronic flash, sharpening, correction of color failures or density failures, correction of under- or over-exposure and the correction of reduced brightness at the edge of image field can be effectively performed to produce prints of the high quality that has not been attainable by the conventional direct exposure technique. What is more, operations such as the synthesis of more than one image, splitting of a single image into more than one image and even the synthesis of characters can be accomplished by processing image data and one can also output prints after performing desired editing and processing steps in accordance with a specific use.

As further advantages, prints can be produced from images (image data) captured with a digital still camera and the like. The capabilities of the digital photoprinter are not limited to outputting images as prints (photos); image data can be supplied to a computer and the like or stored in image data recording media such as a floppy disk; thus, image data can be put to various non-photographic uses.

The digital photoprinter having these salient features consists of the following three basic units: a scanner with which the image recorded on a film is read photoelectrically (which may be referred to as an "image reader"), an image processor with which the image thus read is subjected to image processing so that it is converted to image data for recording purposes; and a printer which scans and exposes a light-sensitive material in accordance with the image data and which performs development and other necessary processing to produce a print (which may be referred to as "an image recorder").

In the scanner, reading light issued from a light source is allowed to be incident on the film and passed through an aperture in a mask to produce projected light bearing the image recorded on the film; the projected light is passed through an optics imaging lens so that it is focused on an image sensor such as a CCD sensor; by photoelectric conversion, the image is read and, if necessary, subjected to various image processing schemes and thereafter sent to the image processor as film's image data (image data signals).

The image processor sets up image processing conditions from the image data captured with the scanner, subjects the image data to specific image processing schemes that comply with the thus set conditions, and sends the processed image data to the printer as output image data (exposure conditions) for image recording.

In the printer, if it is of a type that uses light beams to scan for exposure, light beams are modulated in accordance with the image data sent from the image processor and a light-sensitive material is scan exposed (printed) two-dimensionally with the modulated light beams to form a latent image, which is then subjected to specified development and other necessary processing to produce a print (photo) reproducing the image recorded on the film.

When the original image recorded on a film or the like is output to an image display device or a printer, it is important that the output image have no unrecorded area, or be free from the problem of entire lack of image. To meet this requirement, the image area to be printed output (hereinafter sometimes referred to as "print output image area") is set to be smaller in size than the recorded area of the original image and this print output image area is set in a fixed position (taken-out position) so that its margin on the right side is equal to the left margin and its margin on the top is equal to the bottom margin. Consider, for example, the recorded area of an original image on a 135 (35-mm) film. The size of this area on the film is 36.4 mm (±0.4 mm)×24.4 mm (±0.4 mm) (length×width). If this original image is to be printed out in L size, the print output image area (taken-out area) on the film is 32.07 mm×22.47 mm (length×width) in size and invariably set to be smaller than the recorded area of the original image by about 2.2 mm on both right and left sides and by about 1.0 mm on both top and bottom.

To produce output image data, the image data within the thus fixed print output image area is subjected to electronic scaling at a specified magnification so that it complies with the desired print size such as L size.

Since the print output image area taken-out or cut out on the film is adapted to be smaller than the recorded area of the original image, there is no such problem as the entire lack of image. However, it often occurs that a principal subject recorded at an end of the recorded area of the original image is lost either partially or entirely on an image display screen or a print output image. In this case, the operator of the digital photoprinter has to adjust the print output image area by moving it about while maintaining its size so that it includes the principal subject. However, this results in a considerable drop in processing efficiency if a large volume of original images has to be printed.

Another problem with the original image to be printed or otherwise processed is that a finger of the photographer is recorded at an end of the image together with the principal subject. This leaves the operator with two alternatives: one is of course producing a print output with the finger showing, and the other is producing a print output after the operator has reduced the area of finger silhouette (shadow image of the finger) by moving the print output image area which is set in a fixed position relative to the recorded area of the original image. For the operator who is printing a large volume of original images, this means extra cumbersome operations and the processing efficiency drops considerably.

The same problem occurs if the film is partly exposed to produce a fog that affects the density of the original image. The operator has only two alternatives and produces a print output with the fog either unremoved or reduced in area by moving the print output image area. As a result, the processing efficiency is considerably lowered.

SUMMARY OF THE INVENTION

The present invention has been accomplished under these circumstances and has as an object providing a method of adjusting an output image area for producing an output image from the recorded area of an original image so as to produce output image data that complies with a predetermined output image size, characterized in that appropriate output image data that contains a principal subject but which does not contain any fingers or a fog area can be obtained automatically or by a simple semiautomatic operation, and as a result, the output image data can be obtained from the original image in an efficient manner and the desired output image can be automatically produced.

In order to attain the object described above, the first aspect of the present invention provides a method of adjusting an output image area for producing an output image from a recorded area of an original image within the recorded area of the original image so as to produce output image data that complies with a predetermined output image size, comprising the steps of extracting the recorded area of the original image, extracting at least one region of a principal subject, a finger silhouette and a fog region from the extracted recorded area of the original image to obtain an extracted region, adjusting the output image area automatically in accordance with the extracted region and obtaining the output image data from image data in the adjusted output image area.

Preferably, when the principal subject is extracted from the recorded area of the original image, the output image area is adjusted such that the extracted principal subject is included in the output image area.

Preferably, the principal subject to be extracted is a face.

Preferably, when the finger silhouette or the fog region is extracted from the recorded area of the original image, the output image area is adjusted such that the extracted finger silhouette or fog region is minimized in the output image area.

Preferably, the output image area is automatically adjusted based on preliminarily input or set first auxiliary information.

Preferably, the first auxiliary information includes priority information about which of the principal subject, the finger silhouette and the fog region should be preceded when at least two thereof were extracted from an identical recorded area of the original image.

Preferably, the first auxiliary information includes priority information about which of the principal subject, the finger silhouette and the fog region should be extracted in a more precedent manner.

Preferably, the at least one region of the principal subject, the finger silhouette and the fog region is extracted based on second auxiliary information by an operator.

Preferably, the second auxiliary information is obtained by designating a position of the at least one region of the principal subject, the finger silhouette and the fog region.

Preferably, the step of adjusting the output image area in accordance with the extracted region includes the step of changing a position of the output image area which is taken out from the recorded area of the original image without changing an image size of the output image area which is taken out from the recorded area of the original image.

Preferably, the step of adjusting the output image area in accordance with the extracted region includes the steps of changing an image size of the output image area which is taken out from the recorded area of the original image, at least; and changing a scaling factor of electronic scaling in accordance with the changed image size of the output image area or photoelectrically reading an image in the changed image size of the output image area at a correspondingly varied optical magnification.

Preferably, the changed image size of the output image area has the same aspect ratio as the output image area had before its image size was changed.

Preferably, the original image is a digital image obtained by photoelectric reading of an image recorded on a photographic film, a digital image obtained by shooting with a digital still camera or a digital image acquired via a network.

Preferably, the output image data is output to an image display device or a print output device, recorded on an image data recording medium on delivered via a network.

In order to attain the above-described object, the second aspect of the present invention provides a method of adjusting an output image area for producing an output image from a recorded area of an original image within the recorded area of the original image so as to produce output image data that complies with a predetermined output image size, comprising the steps of extracting the recorded area of the original image, extracting at least one region of a principal subject, a finger silhouette and a fog region from the extracted recorded area of the original image to obtain an extracted region, and issuing information for urging an adjustment of the output image area when it is determined as a result of the extracted region that the adjustment of the output image area is necessary.

Preferably, the information for urging the adjustment of the output image area is at least one of information indicating that the output image area does not contain the principal subject, information indicating that the output image area contains the finger silhouette extracted as the extracted region, and information indicating that the output image area contains the fog region extracted as the extracted region.

Preferably, the information for urging the adjustment of the output image area includes one or more sets of frame lines for the output image area that are represented on an image display device for selection of one set of frame lines and adjusted in accordance with the result of the extracted region obtained.

Preferably, the information for urging the adjustment of the output image area is issued based on preliminarily input or set first auxiliary information.

Preferably, the first auxiliary information includes priority information about which of the principal subject, the finger silhouette and the fog region should be preceded when at least two thereof were extracted from an identical recorded area of the original image.

Preferably, the first auxiliary information includes priority information about which of the principal subject, the finger silhouette and the fog region should be extracted in a more precedent manner.

Preferably, the at least one region of the principal subject, the finger silhouette and the fog region is extracted based on second auxiliary information by an operator.

Preferably, the second auxiliary information is obtained by designating a position of the at least one region of the principal subject, the finger silhouette and the fog region.

Preferably, the adjustment of the output image area includes the step of changing a position of the output image area which is taken out from the recorded area of the original image without changing an image size of the output image area which is taken out from the recorded area of the original image.

Preferably, the adjustment of the output image area includes the steps of changing an image size of the output image area which is taken out from the recorded area of the original image, at least, and changing a scaling factor of electronic scaling in accordance with the changed image size of the output image area or photoelectrically reading an image of the changed image size of the output image area at a correspondingly varied optical magnification.

Preferably, the changed image size of the output image area has the same aspect ratio as the output image area had before its image size was changed.

Preferably, the original image is a digital image obtained by photoelectric reading of an image recorded on a photographic film, a digital image obtained by shooting with a digital still camera or a digital image acquired via a network.

Preferably, the output image data is output to an image display device or a print output device, recorded on an image data recording medium on delivered via a network.

DETAILED DESCRIPTION OF THE INVENTION

The method of the invention for adjusting output image areas is now described in detail with reference to the preferred embodiments shown in the accompanying drawings.

Figure 1:
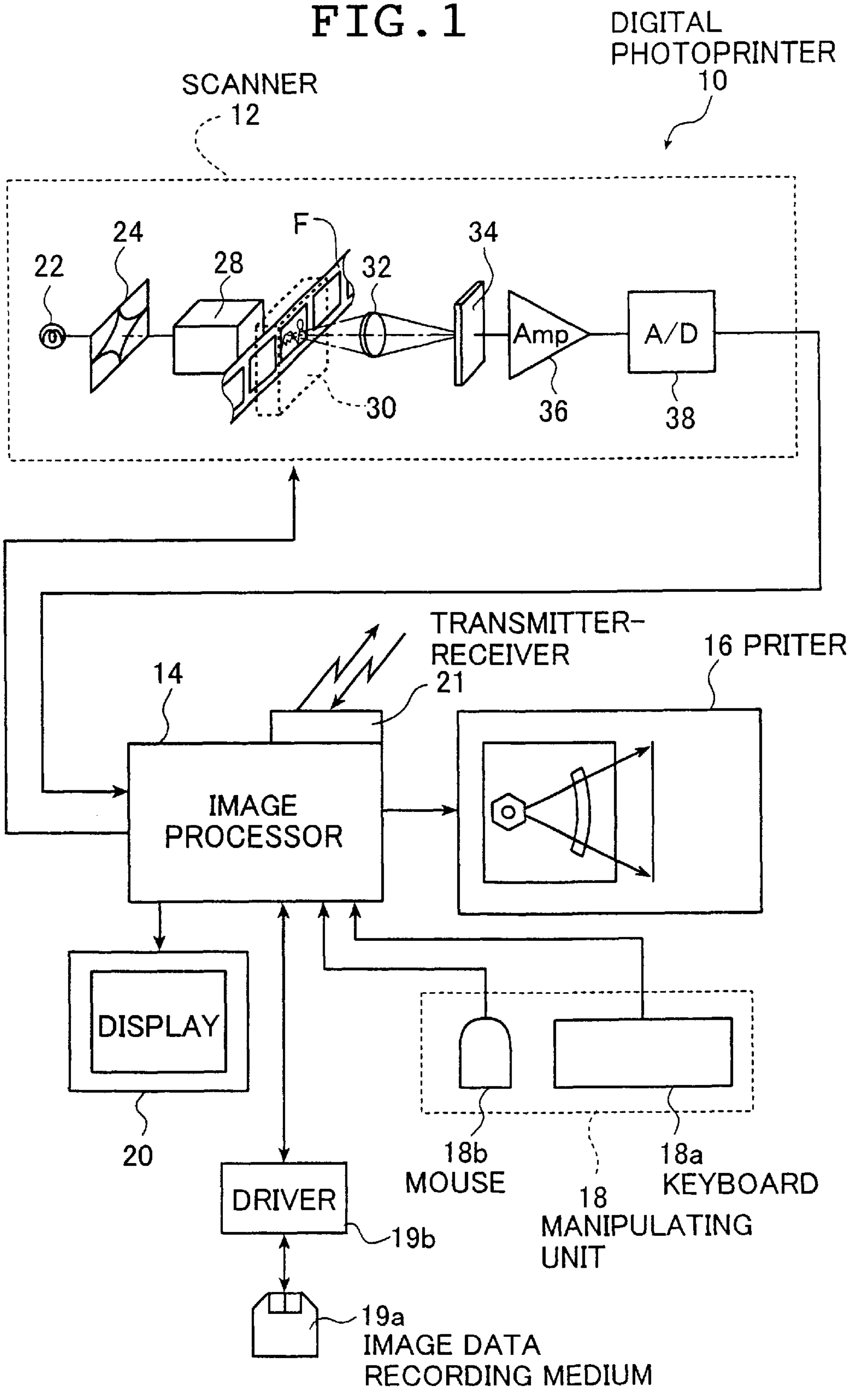
FIG. 1 is a block diagram schematically showing the layout of an exemplary digital photoprinter to which the method of the invention for adjusting output image areas is applied.

FIG. 1 is a block diagram for an exemplary digital photoprinter to which an embodiment of the method of the invention for adjusting output image areas is applied. The digital photoprinter (hereunder referred to simply as "photoprinter") which is generally indicated by 10 in FIG. 1 comprises basically a scanner (image reader) 12 for photoelectrically reading the image recorded on a film F, an image processor 14 which performs image processing on the thus read image data (image information) and with which the photoprinter 10 as a whole is manipulated and controlled, and a printer 16 which performs imagewise exposure of a light-sensitive material (photographic paper) with light beams modulated in accordance with the image data output from the image processor 14 and which performs development and other necessary processing to produce a (finished) print.

The image processor 14 is connected to a manipulating unit 18, a display 20, a driver 19*b* and a transmitter-receiver (two way communication device) 21. The manipulating unit 18 has a keyboard 18*a* and a mouse 18*b* for inputting (setting up) various conditions, for choosing and commanding a specific processing step and for entering a command and so forth for effecting color/density correction, etc. The display 20 represents the image captured with the scanner 12, various manipulative commands, and windows showing setup/registered conditions. The driver 19*b* reads image data from image data recording media 19*a* such as MO, FD, CD-R and a memory of a digital still camera or records image data thereon. The transmitter-receiver 21 performs transmission and reception via a network such as Internet.

The scanner 12 is an apparatus with which the images recorded on film F and the like are read photoelectrically frame by frame. It comprises a light source 22, a variable diaphragm 24, a diffuser box 28 which diffuses the reading light incident on film F so that it becomes uniform across the plane of film F, an imaging lens unit 32, an image sensor assembly 34 having line CCD sensors capable of reading R (red), G (green) and B (blue) images, respectively, an amplifier (Amp) 36, and an A/D (analog/digital) converter 38.

The photoprinter 10 has various dedicated carriers 30 available that can be detachably loaded into the body of the scanner 12 in accordance with film type (whether the film is of an Advanced Photo System or a 135 negative or L reversal film), film size, and film format (whether the film is in strip or slide form). By changing carriers 30, the photoprinter 10 can handle various film types and perform various processing schemes. The images (frames) recorded on film F and processed to produce prints are transported by the carrier to a predetermined reading position.

When an image recorded on film F is read with the scanner 12, the reading light from the light source 22 has its quantity adjusted by the variable diaphragm 24 and is allowed to be incident on film F that has been brought into registry with the predetermined reading position; subsequent transmission of the reading light through film F produces projected light bearing the image recorded on film F.

The carrier 30 has transport roller pairs (not shown) and a mask (also not shown) having a slit. The transport roller pairs are provided on opposite sides of the predetermined reading position in an auxiliary scanning direction which is perpendicular to the main scanning direction (i.e., the direction in which the line CCD sensors in the image sensor assembly 34 extend) and they transport film F with its length being parallel to the auxiliary scanning direction as it is in registry with the reading position. The slit in the mask defines the projected light from film F to have a specified narrow shape, is in registry with the reading position and extends in the main scanning direction.

The reading light is incident on film F as it is being transported by the carrier 30 in the auxiliary scanning direction in registry with the reading position. As a result, film F is scanned two-dimensionally through the slit extending in the main scanning direction to read the individual frame images recorded on film F.

As already mentioned, the reading light passes through film F on the carrier 30 to be converted to image-bearing projected light, which is passed through the imaging lens unit 32 to be focused on the image-receiving plane of the image sensor 34.

The image sensor 34 is a so-called "3-line" color CCD sensor assembly having a line CCD sensor 34R for reading R image, a line CCD sensor 34G for reading G image, and a line CCD sensor 34B for reading B image. As already mentioned, the individual line CCD sensors extend in the main scanning direction. By means of the image sensor 34, the projected light from film F is separated into three primary colors R, G and B and captured photoelectrically.

The output signals from the image sensor 34 are amplified with Amp 36, converted into digital signals in the A/D converter 38 and sent to the image processor 14.

The reading of images with the image sensor 34 in the scanner 12 consists of two scans, the first being "prescan" for reading the image on film F at low resolution and the second being "fine scan" for obtaining image data for the output image. Prescan is performed under prescan reading conditions that are preliminarily set to ensure that the images on all films the scanner 12 is supposed to handle can be read without saturating the image sensor 34. Fine scan is performed under fine scan reading conditions that are set for each frame to ensure that the image sensor 34 is saturated at a density slighter lower than the minimum density for the image (frame) of interest.

The output signals delivered from prescan and fine scan modes are basically the same data except for image resolution and output level.

The scanner 12 in the digital photoprinter 10 is in no way limited to the type that relies upon slit scan for reading images and it may be substituted by an area scanner that floods the entire surface of the image in one frame with the reading light to read it in one step. An example of this alternative type is an area CCD sensor that uses a device for sequentially inserting R, G and B color filters between the light source and film F so as to separate the image on the film F into three primary colors for sequential reading. The area of the image to be read by the area CCD sensor is set wider than the recorded area of the original image.

As mentioned earlier, the digital image signals output from the scanner 12 are sent to the image processor 14 (which is hereunder referred to simply as "processor 14"). Subjected to image processing in the embodiment under consideration are the digital image signals obtained by A/D conversion of the signals that have been captured by photoelectric reading of the image on film F with the scanner 12. Other signals that can be subjected to image processing are digital image signals captured with a digital still camera or the like, digital image signals read from various image data recording media 19*a* and digital image signals for recorded images that are supplied via a variety of networks.

Figure 2:
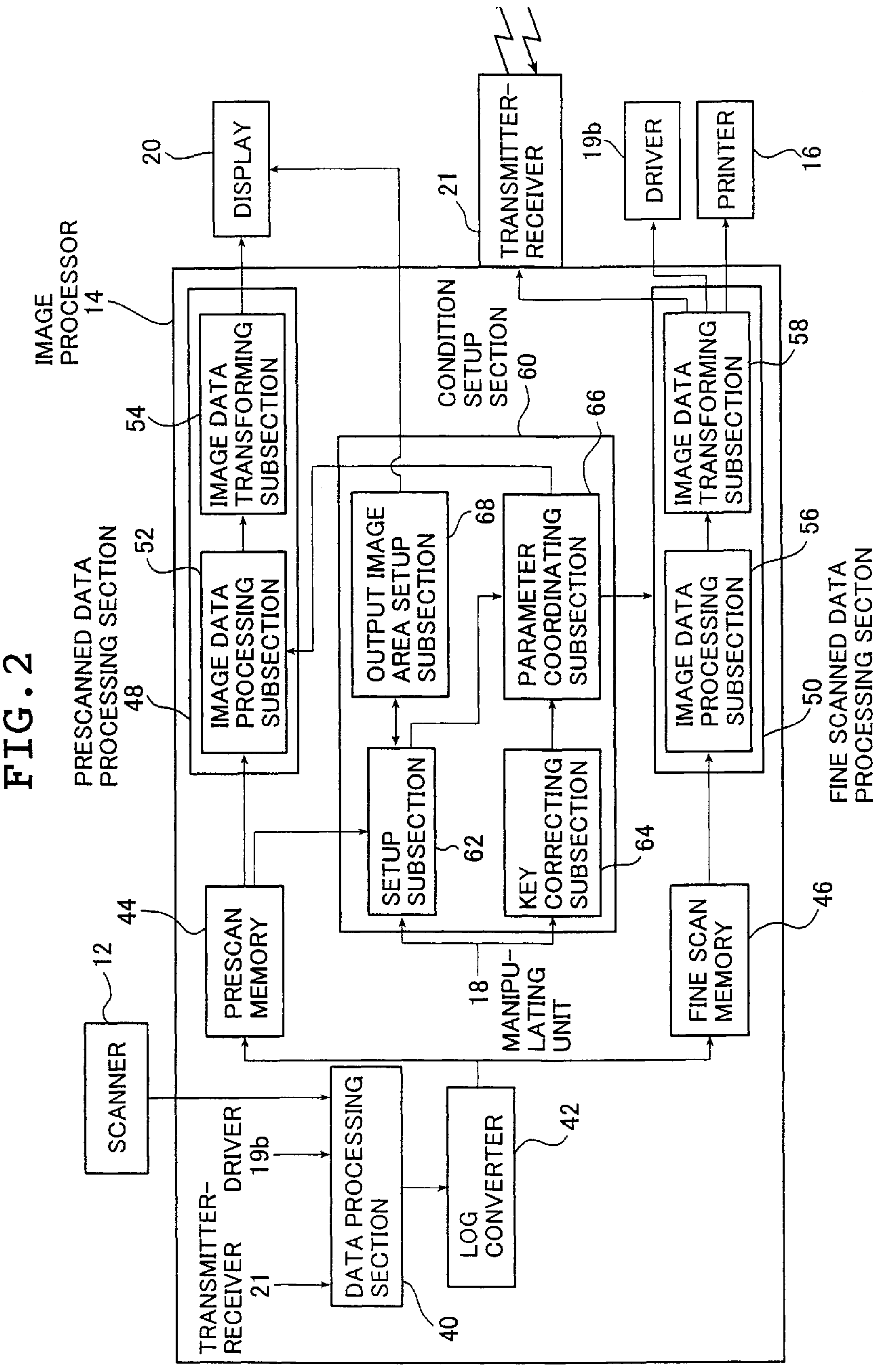
FIG. 2 is a block diagram showing the layout of an exemplary image processor of the digital photoprinter shown in FIG. 1.

FIG. 2 is a block diagram of the processor 14. As shown, the processor 14 comprises a data processing section 40, a log converter 42, a prescan (frame) memory 44, a fine scan (frame) memory 46, a prescanned data processing section 48, a fine scanned data processing section 50, and a condition setup section 60. Note that FIG. 2 mainly shows the sites associated with image processing operations. In practice, the processor 14 has other components such as a CPU for controlling and managing the photoprinter 10 taken as a whole including the processor 14, as well as a memory for storing the necessary information for operating the photoprinter 10. The manipulating unit 18 and the display 20 are connected to various sites in the processor 14 via the CPU and the like (CPU bus).

The R, G and B digital signals output from the scanner 12 are first supplied to the data processing section 40, where they are subjected to various data processing schemes including dark correction, defective pixel correction and shading correction. Thereafter, the digital signals are converted to digital image data (density data) in the log converter 42. Of the digital image data, prescanned data is stored (loaded) in the prescan memory 44 and fine scanned data is stored in the fine scan memory 46.

The prescanned data stored in the prescan memory 44 is then processed in the prescanned data processing section 48 comprising an image data processing subsection 52 and an image data transforming subsection 54, whereas the fine scanned data stored in the fine scan memory 46 is processed in the fine scanned data processing section 50 comprising an image data processing subsection 56 and an image data transforming subsection 58.

In the embodiment under consideration, at least a plurality of original images, for example, all original images in the frames recorded on film F are captured with the line CCD sensors in one action without leaving any interruption between frames; therefore, the prescanned data contains not only the image data for the original images in the prescanned frames but also the base (non-image) area of film F which is the non-recorded area between frames that has been captured as image data.

Before the image processing schemes to be described later are performed, the image data processing subsection 52 of the prescanned data processing section 48 obtains position information about an image area of an original image as detected in a setup subsection 62 of the condition setup section 60 to be described later, that is, a detected image area $G_0$ (see FIGS. 4A and 4B). The image data processing subsection 52 reads prescanned (image) data within the image area $G_0$ of the original image from the prescan memory 44 on the basis of the position information obtained and performs specified image processing schemes on the thus read prescanned data.

The image data processing subsection 56 of the fine scanned data processing section 50 obtains position information about a print output image area P (see FIG. 4B) that was set from the detected image area $G_0$ of the original image in an output image area setup subsection 68 of the condition setup section 60. The image data processing subsection 56 reads fine scanned (image) data within the print output image area P from the fine scan memory 46 on the basis of the position information obtained and performs specified image processing schemes on the thus read fine scanned data.

The image data processing subsection 52 in the prescanned data processing section 48 and the image data processing subsection 56 in the fine scanned data processing section 50 are sites where the image in the detected image area $G_0$ (image data) is subjected to specified image processing schemes under the processing conditions set up by the condition setup section 60 to be described later. The image processing schemes to be performed by the two image data processing subsections are essentially the same except for image resolution.

The image processing schemes to be performed by the two image data processing subsections 52, 56 include at least an electronic scaling step for providing compliance with the size of the output image. Except for this requirement, any known image processing schemes may be performed, as exemplified by gray balance adjustment, gradation correction and density (brightness) adjustment that are performed with LUTs (look-up tables), correction of the type of shooting light source and adjustment of image saturation (color adjustment) that are performed with matrices (MTXs), as well as graininess suppression, sharpness enhancement and dodging (compression/expansion of density's dynamic range).

The image data processed by the image data processing subsection 52 is sent to the image data transforming subsection 54 and, after being optionally reduced in volume, is transformed, typically by means of a 3D (three-dimensional) LUT, into image data suitable for representation on the display 20 to which it is supplied.

The image data processed by the image data processing subsection 56 is sent to the image data transforming subsection 58 and transformed, typically by means of a 3D-LUT, into output image data suitable for image recording by the printer 16 to which it is supplied.

The condition setup section 60 has the following components: the setup subsection 62 for performing an image detection process for detecting the image area $G_0$ of the original image and setting up the conditions for the various processing schemes to be performed in the prescanned data processing section 48 and the fine scanned data processing section 50 as well as the reading conditions for fine scan; a key correcting subsection 64; a parameter coordinating subsection 66; and the output image area setup subsection 68 for adjusting the print output image area P automatically. The print output image area (hereunder referred to simply as "output image area") P that is set in the output image area setup subsection 68 is an image area that is provided within the image area $G_0$ of the original image to ensure that the image within this area P will be printed out in the desired print size.

Figure 4A:
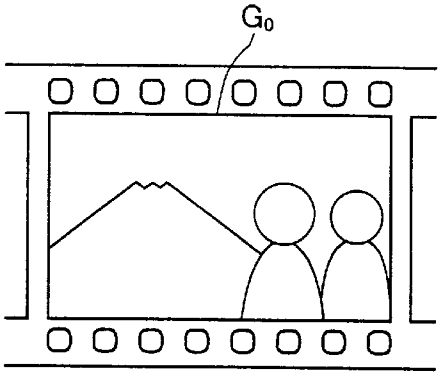
FIGS. 4A, 4B, 4C and 4D show an example of the method of the invention for adjusting output image areas.
Figure 4B:
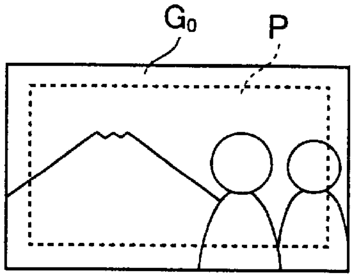

The setup subsection 62 first detects the image area $G_o$ of the original image (see FIG. 4A) by the image detection process to obtain the detected image area $G_0$ (see FIG. 4B). As already mentioned, the prescanned data contains not only the image data for the image area $G_0$ of the original image obtained by prescan but also the image data for the base area of film F between frames of the original image. It is therefore necessary to extract from the prescanned data the image data within the image area $G_0$ of the original image that need be subjected to the image processing schemes to be described later.

For image detection, the right and left edges of the image area $G_0$ of the original image as well as their top and bottom edges are identified from the prescanned data on the basis of image densities. Consider, for example, the case of identifying the right and left edges. The location where the image density along the longitudinal axis of film F varies uniformly in the direction of width perpendicular to the length of film F is detected as an edge of the frame of the original image. Then, the image density of an area near the location which is away from the detected edge by a distance equal to the length of the image area $G_0$ of the original image which is determined by an already known film species is checked and the location where the image density varies uniformly in the direction of the width of film F is detected as the other edge of the frame of the original image. The thus obtained position information about the detected image area $G_0$ is sent to the parameter coordinating subsection 66, the output image area setup subsection 68 and the like. It should be noted here that the image data processing subsection 52 of the prescanned data processing section 48 may perform the image detection process and send the obtained information to the setup subsection 62 of the condition setup section 60.

The setup subsection 62 further reads prescanned data from the prescan memory 44 on the basis of the detected image area $G_0$ of the original image as obtained by the image detection process and, from the thus read prescanned data, constructs density histograms and calculates image characteristic quantities such as average density, highlights (minimum density) and shadows (maximum density) to determine the reading conditions for fine scan. In addition, in response to an optionally entered operator command, the setup subsection 62 sets up the conditions for the various image processing schemes to be performed in the prescanned data processing section 48 and the fine scanned data processing section 50, as exemplified by the construction of LUTs for performing gray balance adjustment, gradation correction and density adjustment, and the construction of MTX operational formulae.

The key correcting subsection 64 calculates the amounts of adjustment of the image processing conditions in accordance with various commands entered from the keyboard 18*a* and the mouse 18*b* to adjust various parameters such as density (brightness), color, contrast, sharpness and saturation; the calculated amounts of adjustment are supplied to the parameter coordinating subsection 66.

The parameter coordinating subsection 66 receives the position information about the detected image area $G_0$ of the original image and the image processing conditions for use in prescanned image data that were both set up by the setup subsection 62 and sends them to the prescanned data processing section 48. At the same time, the parameter coordinating subsection 66 receives the position information about the output image area P that has been automatically set up by the output image area setup subsection 68 and established by operator's verification if necessary via the key correcting subsection 64, the information that the output image area setup subsection 68 produced for urging the adjustment of the output image area P and, optionally, the information about the image size of the output image area P from the output image area setup subsection 68 via the setup subsection 62, and also receives the processing conditions such as those of image processing schemes to be performed on fine scanned image data that have been set up by the setup subsection 62 and established by operator's verification if necessary via the key correcting subsection 64, and coordinates them. The thus coordinated information and processing conditions are then set up in the image data processing subsection 56 of the fine scanned data processing section 50.

The output image area setup subsection 68 is the characterizing part of the invention and, on the basis of the position information about the detected image area $G_0$ of the original image supplied from the setup subsection 62 and the prescanned image data, automatically adjusts the output image area P or, when it is determined that adjustment of the output image area P is necessary, produces the information for urging an operator to adjust the output image area P, which is for example represented on the display 20 or the like.

Figure 3A:
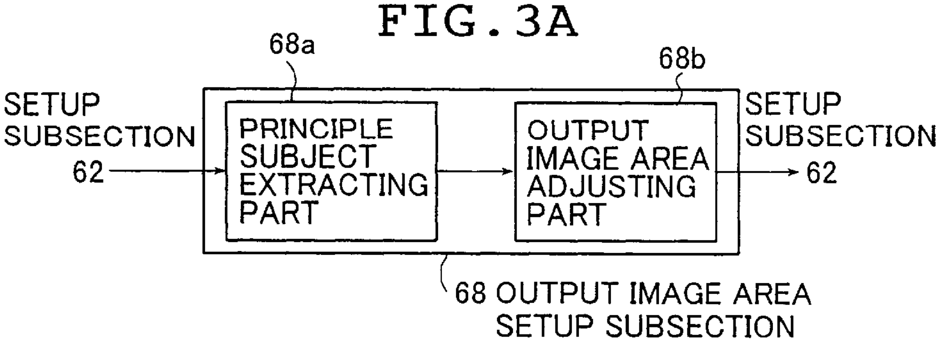
FIG. 3A is a block diagram showing the essential part of an example of the image processor to which the method of the invention for adjusting output image areas is applied.

First, as shown in FIG. 3A, the output image area setup subsection 68 in a first example comprises a principal subject extracting part 68*a* and an output image area adjusting part 68*b*.

The principal subject extracting part 68*a* shown in FIG. 3A extracts the face of a person as a principal subject. While there is no particular limitation on the method of face extraction to be performed in the present invention, several examples worth mentioning are the extraction of flesh color and a circular shape, the extraction of face contour and a circular shape, the extraction of the trunk and a circular shape, the extraction of eyes (structural features within face) and a circular shape, and the extraction of hair on the head and a circular shape. For details of these extraction methods, see commonly assigned Unexamined Published Japanese Patent Application No. 184925/1996, etc.

In the first method of extraction, both flesh color and a circular shape are extracted to thereby extract the face region. To be more specific, the hue and saturation of each pixel are determined from the prescanned data (which may optionally be reduced in volume) and a pixel region (flesh color region) that can be estimated to represent a human flesh color is extracted; then, considering that human faces are generally oval, an oval or circular shape that can be estimated as a human face is further extracted from the region of flesh color and temporarily taken as a candidate for the face region.

In the second method of extraction, the contour of a face is extracted by edge extraction and a circular shape is also extracted to thereby extract a candidate for the face region. Similarly, the third method of extraction comprises extracting the contour of the trunk by edge extraction and extracting a circular shape; the fourth method comprises extracting the human eyes and a circular shape; the fifth method comprises extracting hair on the human head by edge extraction and extracting a circular shape. After extracting candidates for the face region by various methods, the candidate common to all applied methods is extracted as the face region.

Various known methods of extracting principal subjects can also be employed in the present invention and examples are disclosed in Unexamined Published Japanese Patent Application Nos. 346332/1992, 346333/1992, 346334/1992, 100328/1993, 158164/1993, 165119/1993, 165120/1993, 67320/1994, 160992/1994, 160993/1994, 160994/1994, 160995/1994, 122944/1996, 80652/1997, 101579/1997, 138470/1997 and 138471/1997.

The principal subject extracting part 68*a* is not limited to face extraction and it may be of a type that extracts a specified subject such as animals or specified shapes. In this alternative case, the operator may preliminarily enter a specified subject from the key correcting subsection 64 via the keyboard 18*a* or mouse 18*b*.

Figure 3B:
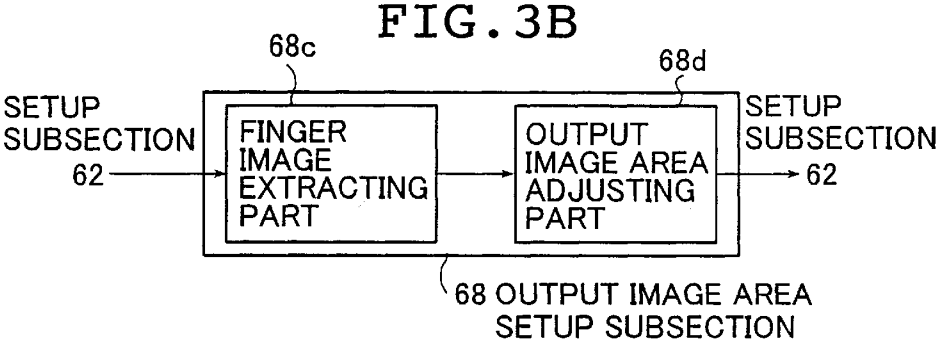
FIG. 3B is a block diagram showing the essential part of another example of the image processor to which the method of the invention for adjusting output image areas is applied.
Figure 3C:
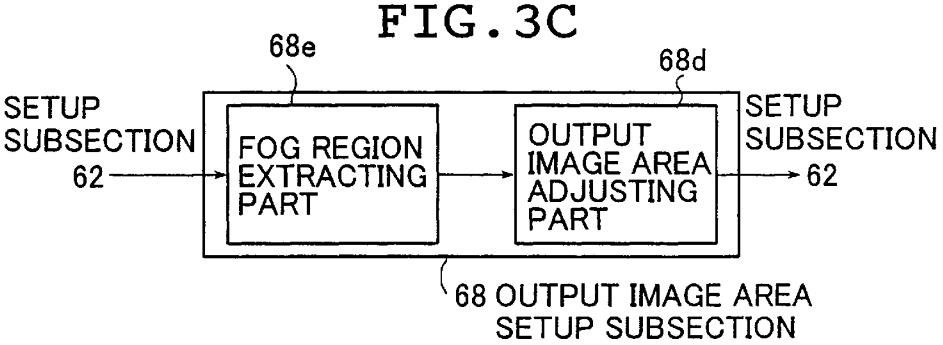
FIG. 3C is a block diagram showing the essential part of yet another example of the image processor to which the method of the invention for adjusting output image areas is applied.
Figure 3D:
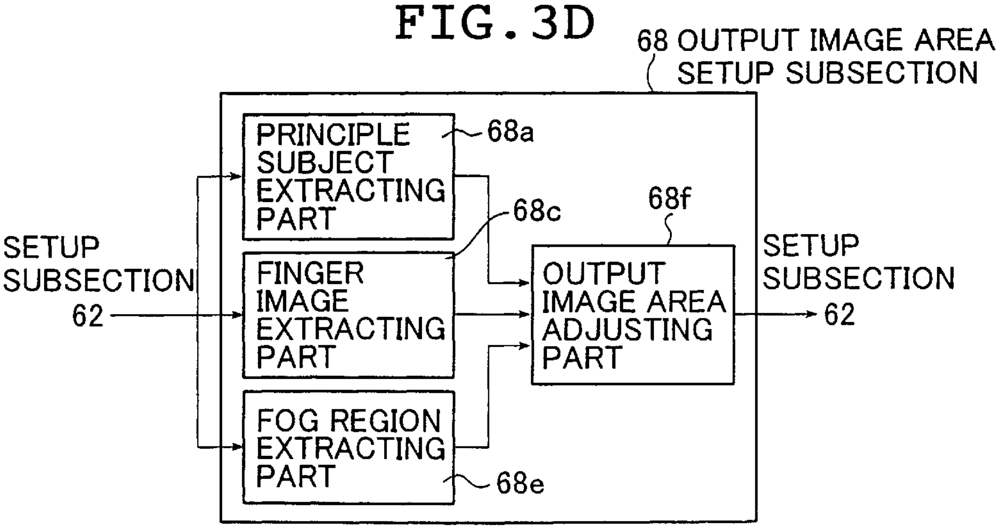
FIG. 3D is a block diagram showing the essential part of still another example of the image processor to which the method of the invention for adjusting output image areas is applied.

If desired, the principal subject extracting part 68*a* may be replaced by a finger silhouette extracting part 68*c* as shown in FIG. 3B or a fog region extracting part 68*e* as shown in FIG. 3C and the output image area adjusting part 68*b* may be replaced by an output image area adjusting part 68*d* (see FIGS. 3B and 3C). Further, one output image area adjusting part 68*f* may be provided for the three parts including the principal subject extracting part 68*a*, the finger silhouette extracting part 68*c* and the fog region extracting part 68*e*, as shown in FIG. 3D. For details about the methods of extracting a finger silhouette region in the finger silhouette extracting part 68*c*, extracting a fog region in the fog region extracting part 68*e*, and adjusting the output image area P in the output image area adjusting parts 68*d* and 68*f*, see below.

The output image area adjusting part 68*b* checks if the obtained principal subject is included in a predetermined output image area P within the image area of the original image on the basis of the result of the area extracted by the principal subject extracting part 68*a*. If the answer is negative, the output image area adjusting part 68*b* does not change the image size of the output image area P but automatically adjusts its position such that it includes the area of the principal subject, or produces the information to be externally issued for urging an operator to adjust the output image area P.

The information about the automatically adjusted output image area P or the information for urging an operator to adjust the output image area P is sent to the parameter coordinating subsection 66 via the setup subsection 62 and then sent to the display 20 together with the image data for the recorded area of the original image obtained by processing in the image data processing subsection 52. The set of frame lines of the automatically adjusted output image area P is represented on the display 20 for verification by an operator. Alternatively, more than one candidate for the set of frame lines of the output image area P to be adjusted is represented on the display 20 together with the information for urging an operator to adjust the output image area P, which prompts and supports the adjustment by the operator.

Forms of the information for urging an operator to adjust the output image area P include "display of characters" for urging the selection from more than one candidate for the set of frame lines of the output image area P represented on the display 20, voice output from a voice output device (not shown), and display or alarm output of a message warning that adjustment of the output image area P is necessary. However, the candidates represented for the set of frame lines of the output image area P to be adjusted may be employed as the information for urging the adjustment of the output image area P.

In the present invention, the information about the automatically adjusted output image area P that has been produced in the output image area setup subsection 68 or the information for urging the adjustment of the output image area P (hereunder also referred to as "adjustment urging information") may be directly sent to the display 20 without passing through the setup subsection 62 or the parameter coordinating subsection 66.

The method of the invention for adjusting output image areas is now described with particular reference to the scanner 12 and the processor 14.

An operator who was asked to produce prints from a sleeve of film F first loads the scanner 12 with a carrier 30 that is compatible with film F, then sets film F (its cartridge) in a specified position on the carrier 30, inputs the necessary commands associated with the size of the prints to be produced and other operational parameters, and gives a command for starting print production.

As a result, the stop-down value of the variable diaphragm 24 in the scanner 12 and the storage time of the image sensor (line CCD sensors) 34 are set in accordance with the reading conditions for prescan. Thereafter, the carrier 30 withdraws film F from the cartridge and transports it in the auxiliary scanning direction at an appropriate speed to start prescan. As already mentioned, film F is subjected to slit scanning in a predetermined reading position and the resulting projected light is focused on the image sensor 34, whereupon the image recorded on film F is separated into R, G and B colors and captured photoelectrically.

During prescan, all frames of film F are continuously read without interruption. Alternatively, continuous reading may be performed in groups each consisting of a specified number of frames.

The output signals being delivered from the image sensor 34 during prescan are amplified with Amp 36 and sent to the A/D converter 38, where they are converted to digital form.

The digital signals are sent to the processor 14, subjected to specified data processing schemes in the data processing section 40, transformed to prescanned data (digital image data) in the log converter 42, and stored in the prescan memory 44.

The prescanned data stored in the prescan memory 44 is read into the condition setup section 60 and supplied to the setup subsection 62.

The setup subsection 62 uses the supplied prescanned data to detect the image area $G_0$ of the original image by the image detection process. On the basis of the prescanned data within the detected image area $G_0$, the setup subsection 62 performs various operations such as the construction of density histograms and the calculation of image characteristic quantities such as average density, LATD (large-area transmission density), highlights (minimum density) and shadows (maximum density). In addition, in response to an optionally entered operator command from the key correcting subsection 64, the setup subsection 62 determines image processing conditions as exemplified by the construction of tables (LUTs) for performing gray balance adjustment, etc. and matrix (MTX) operational formulae for performing saturation correction. Specified image processing schemes to be performed and the image processing conditions thus obtained are supplied to the parameter coordinating subsection 66.

The image processing conditions coordinated with the specified image processing schemes are sent to the image data processing subsection 52 of the prescanned data processing section 48 and in accordance with those image processing conditions, the specified image processing schemes are performed on the prescanned data within the detected image area $G_0$. The processed image data thus obtained is sent to the image data transforming subsection 54 and transformed to image data suitable for representation on the display 20. The thus transformed image data is sent to the display 20 and represented as the processed image.

The prescanned image data within the image area $G_0$ detected by the image detection process performed in the setup subsection 62 is supplied to the output image area setup subsection 68 and a principal subject in the original image is extracted in the principal subject extracting part 68*a*. For example, the above-described methods of face extraction are performed to extract the face region of the recorded subject. If the extracted face region is at an end of the recorded area of the original image, the output image area adjusting part 68*b* does not change the image size but automatically adjusts the position of the output image area P to ensure that it includes all part of the extracted face region. The information about the automatically adjusted output image area P is sent to the prescanned data processing section 48 via the setup subsection 62 and the parameter coordinating subsection 66, and is synthesized with the processed image data in the image data processing subsection 52 and transformed to data for representation on the display 20 in the image data transforming subsection 54. The set of frame lines of the output image area P is represented on the display 20 together with the processed image.

Consider, for example, an original image on film F which shows two persons as principal subjects, the face of one person is at the right end of the recorded area (see FIG. 4A). As shown in FIG. 4B, an image area $G_0$ is detected as the recorded area of the original image (bounded by the solid line in FIG. 4B). Conventionally, a print output image area P (bounded by the dashed line in FIG. 4B) is fixed within the detected image area $G_0$ and part of the face of the person at the right end is not included within the print output image area P. This is not the case with the present invention and the position of the output image area P is adjusted such that the face region of the person at the right end of the recorded area comes within the area P as shown in FIG. 4C.

Figure 4C:
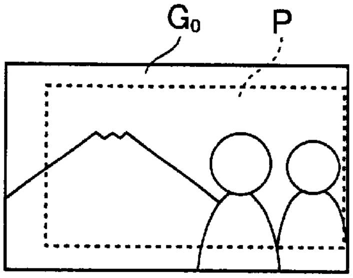

Further explanation is made with reference to FIGS. 4A, 4B and 4C. Since the output image area P is preliminarily set right in the middle of the original image, all pixel positions in the direction of either width or length of the extracted region of a principal subject which is outside the area P are detected. The area P is adjusted automatically by moving it around either in a widthwise or lengthwise direction or in both directions to ensure that all detected pixel positions will be included in the area P. Note that the position of the area P will not be adjusted to go beyond the detected image area $G_0$.

The automatically adjusted output image area P as well as the prescanned and processed image data are represented on the display 20 for verification by the operator.

The operator looks at the image on the display 20 and the frame of the automatically adjusted output image area P. If they are inappropriate, the image processing conditions and the position of the area P are manually adjusted via the key correcting subsection 64. The adjusted image and area P are represented on the display 20 and if the operator finds them appropriate, he proceeds to verification of the image in the next frame.

In the prior art, if a principal subject appears at an end of the original image, the output image area P which is fixed right in the middle of the detected image area $G_0$ has to be manually adjusted in position. In the embodiment of the present invention under consideration, the principal subject is first extracted and the output image area P is adjusted by moving it around such that the principal subject is automatically included in it. As a result, the frequency of manual adjustment of the area P by the operator is sufficiently reduced to improve the efficiency of processing to output prints.

Figure 4D:
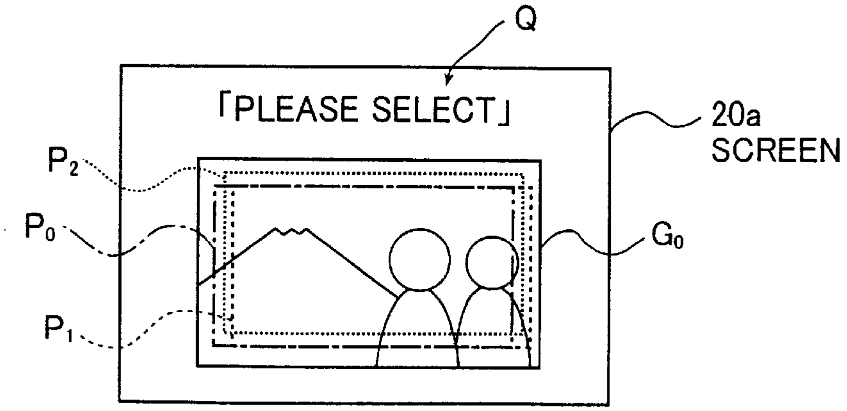

When the output image area P is not automatically adjusted but the information for urging the adjustment of the output image area P is produced in the output image area adjusting part 68*b* of the output image area setup subsection 68, the adjustment urging information may be represented on the display 20 or voice-output. Consider, for example, the preferable case shown in FIG. 4D. The detected image area $G_0$ and the original image within this area are represented on the screen 20*a* of the display 20. At the same time, candidates for the output image area P are represented including a non-adjusted set of frame lines of output image area $P_0$ that completely does not contain the principal subject, and adjusted sets of frame lines of output image area $P_1$ and $P_2$ which contain the principle subject but adopt different adjusting methods. Further, the adjustment urging information Q "PLEASE SELECT" is represented on the screen 20*a* or voice-output so that the operator can select one of the non-adjusted set of frame lines $P_0$ and the adjusted sets of frame lines $P_1$ and $P_2$ and adjust the selected output image area P.

Methods for providing the information for urging the operator to adjust the output image area P are by no means limited to the method mentioned above, and any method can be applied, as far as the operator's attention can be attracted to the method applied. An exemplary method is as follows:

The non-adjusted frame of output image area $P_0$ indicating that the principle subject is completely not contained is simply represented within the detected image area $G_0$ of the screen 20*a* while being flashed or with a noticeably high luminance so as to serve as the adjustment urging information. Alternatively, a warning message such as "PLEASE ADJUST" or "PRINCIPLE SUBJECT CUT OFF" may be represented on the screen 20*a* or voice-output as the adjustment urging information. This method using the keyboard 18*a*, the mouse 18*b*, the correction keys and the like can urge the operator to adjust or set the output image area P.

As a result, when the operator performs verification, manual adjustment of the output image area P by the operator can be greatly facilitated, thus leading to alleviation of the operator's burden in the verification and improvement of the efficiency of processing to output prints.

When the operator completes the verification of all prescanned images, fine scan is started. In the fine scan mode, the conditions for processing the images in individual frames and the information about the position of the output image area P are sent to the fine scanned data processing section 50.

During fine scan and image processing subsequently performed, the scanner 12 reads the original image at a higher resolution than in prescan. The fine scanned data processing section 50 subjects the captured image data to image processing under the conditions determined from the prescanned image and acquires the image data within the adjusted output image area P as output image data.

When the prescan step has ended, film F has been withdrawn from the cartridge or the like to the frame of the last image. During fine scan, the images in the frames are read in reverse order as film F is rewound.

The R, G and B output signals from the scanner 12 are subjected to A/D (analog/digital) conversion, log conversion, DC offset correction, dark correction, shading correction and other operations so that they are transformed to digital input image data, which is then stored (loaded) in the fine scan memory 46.

The fine scanned data stored in the fine scan memory 46 is sent to the image processing subsection 56 and subjected to various image processing schemes such as gray balance adjustment by tables (LUTs) and saturation correction by matrix (MTX) operations under the predetermined conditions. The aberrations due to the taking lens are also corrected in the image processing subsection 56. Subsequently, electronic scaling is performed to provide compliance to the desired print size. After optional sharpening and dodging, the resulting output image data is sent to the image data transforming subsection 58. The output image data to be sent to the image data transforming subsection 58 is only the fine scanned data contained in the output image area P.

In the image data transforming subsection 58, the output image data is transformed to data suitable for outputting prints from the printer 16, to which the image data within the print output image area P is sent as output image data. The output image data may be transformed in the image data transforming subsection 58 to data suitable for recording on the image data recording media 19*a* so that it can be output to the driver 19*b* and recorded on the image data recording media 19*a*. Alternatively, the output image data may be transformed to a format capable of delivery via a network and delivered from the transmitter-receiver 21 via the network.

The printer 16 consists of a recording device (exposing device) that records a latent image on a light-sensitive material (photographic paper) by exposing it in accordance with the supplied image data and a processor (developing device) that performs specified processing schemes on the exposed light-sensitive material and which outputs it as a print.

In the recording device, the light-sensitive material is cut to a specified length as determined by the print to be finally output and, thereafter, three light beams for exposure to R, G and B that are determined by the spectral sensitivity characteristics of the light-sensitive material are modulated in accordance with the image data output from the image processor 14; the three modulated light beams are deflected in the main scanning direction while, at the same time, the light-sensitive material is transported in the auxiliary scanning direction perpendicular to the main scanning direction so as to record a latent image by two-dimensional scan exposure with said light beams. The latent image bearing light-sensitive material is then supplied to the processor. Receiving the light-receiving material, the processor performs a wet development process comprising color development, bleach-fixing and rinsing; the thus processed light-sensitive material is dried to produce a print; a plurality of prints thus produced are sorted and stacked in specified units, say, one roll of film.

Basically described above is the method of the invention for adjusting output image areas using the scanner 12 and the processor 14.

In the embodiment described above, adjustment of output image areas consists of extracting a recorded principal subject in the output image area setup subsection 68 and adjusting the output image area P automatically in accordance with the region of the extracted principal subject or producing and issuing the adjustment urging information of the output image area P. In another embodiment, the output image area setup subsection 68 may be composed of a finger silhouette extracting part 68*c* and an output image area adjusting part 68*d* as shown in FIG. 3B. In this case, the region where a finger silhouette shows is extracted and the output image area P is adjusted automatically to ensure that the extracted region is excluded from the area P as much as possible. Alternatively, the adjustment urging information of the output image area P may be produced and issued. Automatic adjustment of the output image area P is now described as a typical example.

Figure 5A:
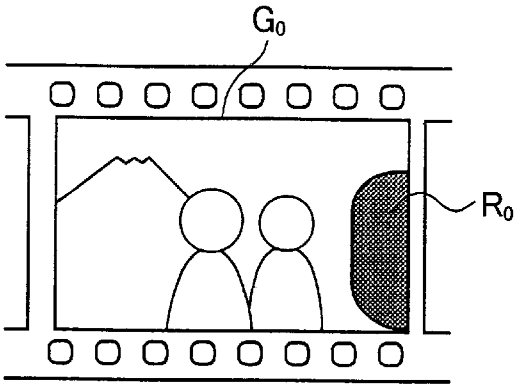
FIGS. 5A, 5B and 5C show another example of the method of the invention for adjusting output image areas.

Consider an original image that involves a finger silhouette region $R_0$ as shown in FIG. 5A. The image size of the output image area P is not changed but its position is adjusted by moving it around to ensure that it includes a minimum of the finger silhouette region $R_0$. The set of frame lines of the positionally adjusted output image area P is represented on the display 20 together with the prescanned image that has been subjected to the necessary image processing schemes.

Extraction of the finger silhouette region is performed in the finger silhouette extracting part 68*c* and adjustment of the output image area P is performed in the output image area adjusting part 68*d*. The respective steps are performed by the following methods.

First suppose the detected image area $G_0$ which has been detected as the recorded area of the original image. Continuous regions extending from the edge of the area $G_0$ into the recorded area of the original image are extracted by a known technique such as cluster division using a K averaging algorithm. In a typical case, a three-dimensional characteristic space is determined that sets the image densities of R, G and B pixels as coordinates and divided into clusters using a K averaging algorithm. Since the finger in the finger silhouette is a continuous region extending from the edge of the detected image area $G_0$, clusters are chosen that extend continuously from the edge of the detected image area $G_0$ and the desired regions are extracted.

Alternatively, regions are extracted that extend continuously from the edge of the image frame and which have a differential image density within a specified range between adjacent pixels.

The desired regions may also be extracted by choosing clusters that have a differential image density within a specified range between adjacent pixels.

The prescanned data to be used in the methods described above is preferably the image data processed by means of a low-pass filter.

Then, for each of the extracted regions, check is made to see if the average of the hue is within a specified range, or the range of the hue of the flesh-color portion of the finger, thereby narrowing the list of the extracted regions. This hue check is made by first transforming the RGB space to the L*a*b* color space and then determining the hue angle $\tan^{-1}(b^*/a^*)$.

Further check is made to see if the average density of the regions on the narrowed list is equal to or above a specified value (if the original image was taken with the aid of an electronic flash) or equal to or below a specified value (if no electronic flash was used), thereby further narrowing the list of the extracted regions. Consider, for example, the case where film F is a negative. Check is made to see if the density on the negative film is equal to or above 2.0 (if the original image was taken with the aid of an electronic flash) or equal to or below 0.3 (if no electronic flash was used).

To further narrow the list, check is made to see if the difference between the average density of the candidates for the finger region and that of the other image area is equal to or above a specified value. In the case where film F is a negative, the specified value is 1.0 in terms of the density on the negative film (if the original image was taken with the aid of an electronic flash) or 0.3 (if no electronic flash was used).

In the next step, check is made to see if the variance of the image density of the candidates on the narrowed list is equal to or below a specified value and regions that pass this check are chosen.

Finally, shape analysis is performed to see which of the chosen regions has an edge shape similar to a finger and the region that passes the test is identified as the finger region. The method of shape analysis is the same as what is employed to determine the edge direction in the extraction of face contour and a circular shape or any other of the already-described methods of face extraction.

Thus, the finger silhouette region can be extracted by narrowing the list of candidates for regions in each of the steps described above. It should be noted here that the steps described above are not the only ways to extract the finger silhouette region and the techniques employed there may be increased in number or replaced by any other suitable techniques.

The information about the finger silhouette region extracted in the finger silhouette extracting part 68*c* is sent to the output image area adjusting part 68*b* for adjusting the position of the output image area P. Stated more specifically, the positions of pixels in either a widthwise or lengthwise direction of the image in that part of the finger silhouette region $R_0$ which lies within the output image area P are detected and the position of the area P is adjusted by moving it about in either a widthwise or lengthwise direction of the image or in both directions in order to exclude the detected pixel positions from the area P or minimize the finger silhouette region $R_0$ that is included within the area P. Note that the position of the area P will not be adjusted to go beyond the detected image area $G_0$.

Figure 5B:
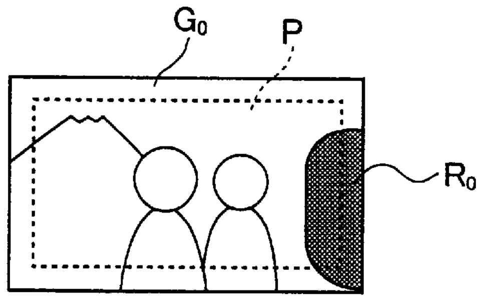
Figure 5C:
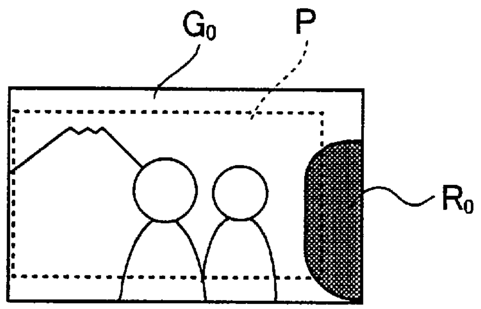

Consider, for example, the case where the original image includes an extracted finger silhouette region $R_0$ at the right end as shown in FIG. 5A and one detects that part of the finger silhouette region $R_0$ that is included in the output image area P which is preliminarily set right in the middle of the original image. Conventionally, the area P is fixed right in the middle of the detected image area $G_0$ as shown in FIG. 5B, so a relatively large portion of the finger silhouette region $R_0$ is contained near the right end of the area P. This is not the case with the present invention and as shown in FIG. 5C, the position of the area P which includes a minimum of the finger silhouette region $R_0$ is automatically determined.

Thus, in the present invention, if the original image involves a finger silhouette, the position of the output image area P which is eventually to be output on print is adjusted automatically to ensure that it includes a minimum of the finger silhouette region. As a result, the frequency of manual adjustment of the area P by the operator is sufficiently reduced to improve the efficiency of processing to output prints.

The inclusion of a minimum of the finger silhouette region in the output image area P offers another advantage of reducing the adverse effects of the finger silhouette in the original image and thereby increasing the added value of prints or reproduced images.

In the embodiment described above, the finger silhouette extracting part 68*c* extracts the finger silhouette region and the output image area adjusting part 68*d* automatically adjusts the output image area P or issues the adjustment urging information for the output image area P in accordance with the extracted region. If desired, the finger silhouette extracting part 68*c* may be replaced by a fog region extracting part 68*e* as shown in FIG. 3C to permit the extraction of a fog region.

Figure 7A:
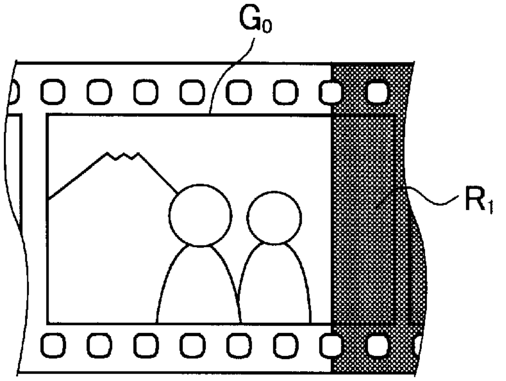
FIGS. 7A, 7B and 7C show still another example of the method of the invention for adjusting output image areas.
Figure 8A:
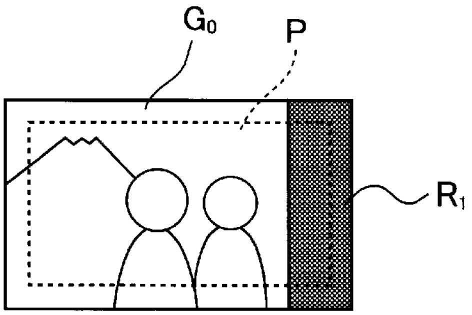
FIGS. 8A and 8B show further another example of the method of the invention for adjusting output image areas.

To extract a fog region in the fog region extracting part 68*e*, the following steps may be followed. The case of extracting the fog region $R_1$ that is included in the right side of the original image, for example, as shown in FIG. 7A is now described as a typical example.

First suppose the detected image area $G_0$ which has been detected as the recorded area of the original image. Continuous regions extending from the edge of the area $G_0$ into the recorded area of the original image are extracted by a known technique such as cluster division using a K averaging algorithm. In a typical case, a three-dimensional characteristic space is determined that sets the image densities of R, G and B pixels as coordinates and divided into clusters using a K averaging algorithm. Since the fog region $R_1$ is a continuous region extending from the edge of the detected image area $G_0$, clusters are chosen that extend continuously from the edge of the detected image area $G_0$ and the desired regions are extracted.

Alternatively, regions are extracted that extend continuously from the edge of the image frame and which have a differential image density within a specified range between adjacent pixels.

The desired regions may also be extracted by choosing clusters that have a differential image density within a specified range between adjacent pixels.

The prescanned data to be used in the methods described above is preferably the image data processed by means of a low-pass filter.

Then, check is made to see if the average density of the extracted regions is equal to or above a specified value, say, 2.0 in terms of the density on a negative film (if film F is a negative), thereby narrowing the list of candidates to those which pass the test.

To further narrow the list, check is made to see if the difference between the average density of the candidates for the fog region and that of the other image area is equal to or above a specified value. In the case where film F is a negative, the specified value is 1.0 in terms of the density on the negative film.

In the next step, check is made to see if the variance of the image density of the candidates on the narrowed list is equal to or below a specified value and regions that pass this check are chosen.

Finally, check is made to see if the pixels that are located in a non-recorded area (the area of the film base around the detected image area $G_0$) near the regions on the narrowed list and which have image densities within a specified value relative to the average density of the regions on the narrowed list occupy an area equal to or larger than a specified value and the region that passes the test is identified as the fog region.

Thus, the fog region can be extracted by narrowing the list of candidates for regions in each of the steps described above. It should be noted here that the steps described above are not the only ways to extract the fog region $R_1$ and the techniques employed there may be increased in number or replaced by any other suitable techniques.

Figure 7B:
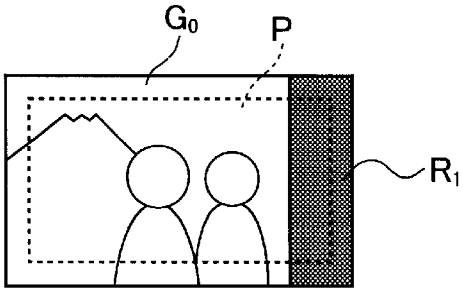
Figure 7C:
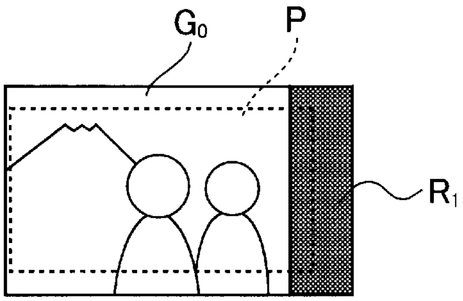

As in the case of the finger silhouette region $R_0$, also for the extracted fog region $R_1$, the output image area adjusting part 68*d* automatically adjusts the output image area P by moving it about while maintaining its image size from the conventional position where the area P is fixed right in the middle of the detected image area $G_0$ as shown in FIG. 7B, so a relatively large portion of the fog region $R_1$ is contained near the right end of the area P to the position of the area P which contains a minimum of the fog region $R_1$ as shown in FIG. 7C, or produces the adjustment urging information for the output image area P. Data is constructed for the set of frame lines of the adjusted output image area P and used as the position information about the output image area P, or the adjustment urging information of the output image area P is produced in the form of data. The position information and the adjustment urging information are sent via the setup subsection 62 and the parameter coordinating subsection 66 to the display 20 in which the set of frame lines of the area P is displayed and the adjustment urging information is displayed or voice-output.

Methods for extracting the principal subject, finger silhouette region and fog region according to the present invention are by no means limited to the embodiments mentioned above, and various automatic extraction processes or semiautomatic region extracting processes may be applied. For instance, the position within each of the principle subject region, finger silhouette region and fog region may be designated with the keyboard 18*a* and the mouse 18*b* as the auxiliary information for the operator so that the image data in the designated position can be used to automatically extract each of the principle subject region, finger silhouette region and fog region. When performing in particular semiautomatic adjustment of the output image area P or verification of the reproduced image using the reproduced image of the original image represented on the verification screen and the detected image area $G_0$ thereof, the adjustment urging information for the output image area P, and the sets of frame lines $P_1$, $P_2$ and $P_0$ represented as the candidates for the output image area P, it is easy to designate the position within each of the principle subject region, finger silhouette region and fog region, which is thus preferable. This process enables significant improvement of the accuracy in extracting each of the principle subject, finger silhouette and fog image.

While the output image area P is adjusted automatically in accordance with the region extracted as a result of extraction of a principal subject, a finger silhouette or a fog region, or the adjustment urging information for semiautomatic adjustment is produced, two or more of these regions may be extracted to provide a basis for adjustment of the area P. In this alternative case, it is preferred that the operator can preliminarily input or set the order of extraction and the priority to be given in adjustment of the area P as the auxiliary information.

For example, the output image area setup subsection 68 may comprise the principle subject extracting part 68*a*, the finger silhouette extracting part 68*c* and the fog region extracting part 68*e*, and an output image area adjusting part 68*f* connected to these parts, as shown in FIG. 3D.

The principle subject extracting part 68*a*, the finger silhouette extracting part 68*c* and the fog region extracting part 68*e* perform the extraction processes as mentioned above. The respective extraction processes are preferably performed in parallel or by pipelining but may be performed on a preliminarily set priority basis. The operator can preferably input or set the priority preliminarily as the auxiliary information.

In another preferred embodiment, the output image area adjusting part 68*f* automatically adjust the results of extraction of the principle subject, finger silhouette and fog image, or displays the set of frame lines of the output image area P, or displays or voice-outputs the adjustment urging information according to the priority preliminarily set by the operator. It should be noted here that, on the basis of the results of extraction of the principle subject, finger silhouette and fog image, the output image area adjusting part 68*f* also automatically adjusts the output image area P or produces the adjustment urging information for semiautomatic adjustment as in the output image area adjusting parts 68*b* and 68*d* mentioned above.

Further, the layout of the output image area setup subsection 68 in the present invention is not limited to the embodiments shown in FIGS. 3A–3D, but the three types of the output image area setup subsections 68 shown in FIGS. 3A–3C may be connected to each other in series (cascade connection) or in parallel in a specified order.

All of the output image area adjusting parts 68*b*, 68*d* and 68*f* adjust automatically the position of the output image area P without changing its image size or produces the adjustment urging information for semiautomatic adjustment. If desired, a corrected print output image area (hereunder referred to as "corrected output image area") P' may be set by not only adjusting the position of the area P but also changing its image size in accordance with the region extracted in the principal subject extracting part 68*a* or finger silhouette extracting part 68*c* or fog region extracting part 68*e*. The aspect ratio of the area P' is preferably the same as that of the area P and the reason is as follows. In order to obtain print images of the same image size, the image data in the area P' has to be subjected to electronic scaling with a magnification coefficient (scaling factor) different from the one for electronic scaling of the image data in the area P. If the area P' has a different aspect ratio than the area P, it cannot wholly be output on a print but part of it has to be cut off.

If the image data in the output image area P which remains the same in image size is to be subjected to electronic scaling with a specified magnification, the magnification of electronic scaling of the image data in the corrected output image area P' which has been adjusted in position and changed in image size as well is made different by an amount corresponding to the change in image size.

FIGS. 6A and 6B, and FIGS. 8A and 8B show an example of changing the image size of the output image area P, respectively. Suppose first that part of the finger silhouette region $R_0$ or the fog region $R_1$ is included in the output image area P which is preliminarily set right in the middle of the detected image area $G_0$ (see FIG. 6A or FIG. 8A). In order to minimize the part of the finger silhouette region $R_0$ or the fog region $R_1$ which is included within the area P, the position of the area P is adjusted with the detected image area $G_0$ see FIG. 6B or FIG. 8B). In addition, the image size of the area P is varied without changing the aspect ratio of the image, thereby preparing a corrected output image area P' that completely excludes the finger silhouette region $R_0$ or the fog region $R_1$. (see FIG. 6B or FIG. 8B). Since the area P' has a different image size than the area P, the information about this image size is sent, after image verification, to the fine scanned data processing section 50 together with the position information about the area P' via the setup subsection 62 and the parameter coordinating subsection 66.

Then, electronic scaling with a modified magnification is performed in the image data processing subsection 56 in accordance with the desired size of the prints to be output.

Figure 6A:
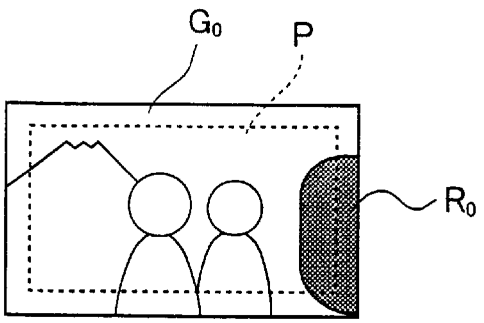
FIGS. 6A and 6B show yet another example of the method of the invention for adjusting output image areas.
Figure 6B:
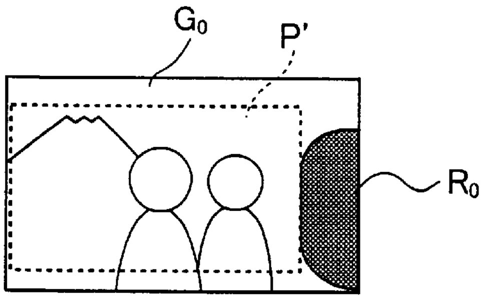
Figure 8B:
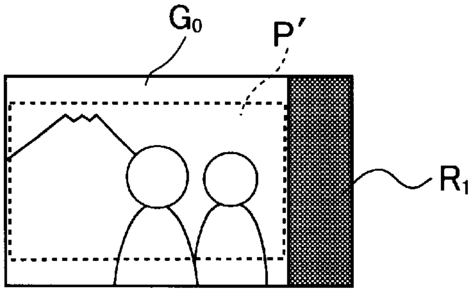

As in the case shown in FIG. 6B or FIG. 8B, when significantly high image quality is required or output print size is large, slight reduction of image quality may be also often raised because the magnification in electronic scaling is changed, that is, the image is enlarged by the ratio of the output image area P of the corrected output image area P' (see FIG. 6B or FIG. 8B). In such a case, instead of changing the magnification in electronic scaling, the optical magnification of the imaging of the imaging lens unit 32 of the scanner 12 is changed (or enlarged) to focus on the image sensor 34 the image having the corrected output image area P' in the center and having the same size as the output image area P so that fine scan can be performed to read the image in the corrected output image area P' photoelectrically.

This process can provide high quality images without any deterioration in image quality, even if image processing schemes to be performed in the image processor 14, in particular the fine scanned data processing section 50 after fine scan is performed are not changed.

While the method of adjusting the print output image area P automatically in the output image area setup subsection 68 has been described on the foregoing pages, it should be noted that the output image area to be adjusted by the method of the invention is by no means limited to the print output image area P for producing print output images and it may be a display output image area to be represented on the display 20, or a reproducing image area for recording on the image data recording media 19*a* or delivering via a network. In the alternative first case, the display 20 represents for example an image within the automatically adjusted display output image area.

In the embodiments described above, the image processor 14 sets the print output image area P on the basis of prescanned data that has been obtained by reading at low resolution and subsequent image processing. If desired, when setting up the image processing conditions, the output image area P may be set on the basis of prescanned data which is yet to be subjected to image processing. Alternatively, the prescan step may be omitted and on the basis of the image data obtained by reducing in volume or otherwise processing the fine scanned data obtained by reading at high resolution for outputting prints, the image processing conditions and the output image area P are set up and an image is represented on the display 20 for operator verification.

While the method of the invention for adjusting output image areas has been described above in detail, the invention is by no means limited to the foregoing embodiments and various improvements and modifications may of course be made without departing from the scope and spirit of the invention.

As described on the foregoing pages in detail, at least one of the three regions, a principal subject, a finger silhouette and a fog region, is extracted and an output image area is adjusted automatically in accordance with the extracted region or adjusted semi-automatically in accordance with the adjustment urging information that was produced in compliance with the extracted region. Hence, manual adjustment of the output image area by the operator is sufficiently reduced in frequency or greatly facilitated, thus leading to alleviation of the operator's burden in the verification and improvement of the processing efficiency. In addition, the present invention can increase the added value of prints by producing print output images that contain the principle subject as much as possible but the least amount of finger silhouette or fog regions.

What is claimed is:

1. A method of adjusting an output image area for producing an output image from a recorded area of an original image within the recorded area of said original image so as to produce output image data that complies with a predetermined output image size, comprising the steps of:

extracting the recorded area of the original image;

extracting at least one region of a principal subject, a finger silhouette and a fog region from the extracted recorded area of the original image to obtain an extracted region;

adjusting said output image area automatically in accordance with the extracted region; and obtaining the output image data from image data in the adjusted output image area.

2. The method according to claim 1, wherein when said principal subject is extracted from the recorded area of said original image, said output image area is adjusted such that the extracted principal subject is included in the output image area.

3. The method according to claim 2, wherein said principal subject to be extracted is a face.

4. The method according to claim 1, wherein when said finger silhouette or said fog region is extracted from the recorded area of said original image, said output image area is adjusted such that the extracted finger silhouette or fog region is minimized in the output image area.

5. The method according to claim 1, wherein said output image area is automatically adjusted based on preliminarily input or set first auxiliary information.

6. The method according to claim 5, wherein said first auxiliary information includes priority information about which of the principal subject, the finger silhouette and the fog region should be preceded when at least two thereof were extracted from an identical recorded area of the original image.

7. The method according to claim 5, wherein said first auxiliary information includes priority information about which of said principal subject, said finger silhouette and said fog region should be extracted in a more precedent manner.

8. The method according to claim 1, wherein said at least one region of the principal subject, the finger silhouette and the fog region is extracted based on second auxiliary information by an operator.

9. The method according to claim 8, wherein said second auxiliary information is obtained by designating a position of said at least one region of the principal subject, the finger silhouette and the fog region.

10. The method according to claim 1, wherein the step of adjusting said output image area in accordance with the extracted region includes the step of:

changing a position of said output image area which is taken out from the recorded area of the original image without changing an image size of said output image area which is taken out from the recorded area of the original image.

11. The method according to claim 1, wherein the step of adjusting said output image area in accordance with the extracted region includes the steps of:

changing an image size of said output image area which is taken out from the recorded area of the original image, at least; and changing a scaling factor of electronic scaling in accordance with the changed image size of the output image area or photoelectrically reading an image in the changed image size of the output image area at a correspondingly varied optical magnification.

12. The method according to claim 11, wherein said changed image size of the output image area has the same aspect ratio as said output image area had before its image size was changed.

13. The method according to claim 1, wherein said original image is a digital image obtained by photoelectric reading of an image recorded on a photographic film, a digital image obtained by shooting with a digital still camera or a digital image acquired via a network.

14. The method according to claim 1, wherein said output image data is output to an image display device or a print output device, recorded on an image data recording medium on delivered via a network.

15. A method of adjusting an output image area for producing an output image from a recorded area of an original image within the recorded area of said original image so as to produce output image data that complies with a predetermined output image size, comprising the steps of:

extracting the recorded area of the original image;

extracting at least one region of a principal subject, a finger silhouette and a fog region from the extracted recorded area of the original image to obtain an extracted region; and issuing information for urging an adjustment of said output image area when it is determined as a result of the extracted region that the adjustment of said output image area is necessary.

16. The method according to claim 15, wherein the information for urging the adjustment of said output image area is at least one of information indicating that said output image area does not contain the principal subject, information indicating that said output image area contains the finger silhouette extracted as the extracted region, and information indicating that said output image area contains the fog region extracted as the extracted region.

17. The method according to claim 15, wherein the information for urging the adjustment of said output image area includes one or more sets of frame lines for the output image area that are represented on an image display device for selection of one set of frame lines and adjusted in accordance with the result of the extracted region obtained.

18. The method according to claim 15, wherein said information for urging the adjustment of said output image area is issued based on preliminarily input or set first auxiliary information.

19. The method according to claim 18, wherein said first auxiliary information includes priority information about which of the principal subject, the finger silhouette and the fog region should be preceded when at least two thereof were extracted from an identical recorded area of the original image.

20. The method according to claim 18, wherein said first auxiliary information includes priority information about which of said principal subject, said finger silhouette and said fog region should be extracted in a more precedent manner.

21. The method according to claim 15, wherein said at least one region of the principal subject, the finger silhouette and the fog region is extracted based on second auxiliary information by an operator.

22. The method according to claim 21, wherein said second auxiliary information is obtained by designating a position of said at least one region of the principal subject, the finger silhouette and the fog region.

23. The method according to claim 15, wherein the adjustment of said output image area includes the step of:

changing a position of said output image area which is taken out from the recorded area of the original image without changing an image size of said output image area which is taken out from the recorded area of the original image.

24. The method according to claim 15, wherein the adjustment of said output image area includes the steps of:

changing an image size of said output image area which is taken out from the recorded area of the original image, at least; and changing a scaling factor of electronic scaling in accordance with the changed image size of the output image area or photoelectrically reading an image of the changed image size of the output image area at a correspondingly varied optical magnification.

25. The method according to claim 24, wherein said changed image size of the output image area has the same aspect ratio as said output image area had before its image size was changed.

26. The method according to claim 15, wherein said original image is a digital image obtained by photoelectric reading of an image recorded on a photographic film, a digital image obtained by shooting with a digital still camera or a digital image acquired via a network.

27. The method according to claim 15, wherein said output image data is output to an image display device or a print output device, recorded on an image data recording medium on delivered via a network.

* * * * *